(12) United States Patent
Park et al.

(10) Patent No.: US 12,389,747 B2
(45) Date of Patent: Aug. 12, 2025

(54) DISPLAY DEVICE

(71) Applicant: Samsung Display Co., LTD., Yongin-si (KR)

(72) Inventors: Ju Chan Park, Seoul (KR); Sun Ho Kim, Seongnam-si (KR); Ok-Kyung Park, Hwaseong-si (KR); Hyang-A Park, Seoul (KR); Sun Hee Lee, Hwaseong-si (KR)

(73) Assignee: Samsung Display Co., Ltd., Suwon-si (KR)

( * ) Notice: Subject to any disclaimer, the term of this patent is extended or adjusted under 35 U.S.C. 154(b) by 605 days.

(21) Appl. No.: 17/713,201

(22) Filed: Apr. 4, 2022

(65) Prior Publication Data

US 2022/0352280 A1 Nov. 3, 2022

(30) Foreign Application Priority Data

Apr. 30, 2021 (KR) .................. 10-2021-0056534

(51) Int. Cl.
| | |
|---|---|
| *H10K 59/121* | (2023.01) |
| *G09G 3/3233* | (2016.01) |
| *H10D 86/40* | (2025.01) |
| *H10D 86/60* | (2025.01) |
| *H10K 59/35* | (2023.01) |
| *H10K 59/88* | (2023.01) |

(52) U.S. Cl.
CPC ....... *H10K 59/1213* (2023.02); *G09G 3/3233* (2013.01); *H10K 59/88* (2023.02); *G09G 2300/0413* (2013.01); *H10D 86/441* (2025.01); *H10D 86/60* (2025.01); *H10K 59/351* (2023.02)

(58) Field of Classification Search
CPC .... G09G 3/3233; G09G 3/3241; H10D 86/60; H10D 86/441; H10K 59/10; H10K 59/35; H10K 59/88; H10K 59/131; H10K 59/351; H10K 59/1213
USPC ........................................................ 257/89
See application file for complete search history.

(56) References Cited

U.S. PATENT DOCUMENTS

| | | |
|---|---|---|
| 8,941,555 B2 | 1/2015 | Yoo et al. |
| 9,311,855 B2 | 4/2016 | Jung et al. |

(Continued)

FOREIGN PATENT DOCUMENTS

| | | |
|---|---|---|
| KR | 10-0669728 | 1/2007 |
| KR | 10-1581368 | 12/2015 |

(Continued)

OTHER PUBLICATIONS

Korean Office Action dated Jan. 23, 2025, in Korean Patent Application No. 10-2021-0056534.

*Primary Examiner* — Fazli Erdem
(74) *Attorney, Agent, or Firm* — Sughrue Mion, PLLC

(57) ABSTRACT

A display device includes a first display area; a second display area disposed adjacent to the first display area; a driver at least partially disposed in the second display area; a plurality of first light emitting elements disposed in the first display area; a plurality of second light emitting elements disposed in the second display area and including a boundary light emitting element adjacent to the first display area and a driver light emitting element overlapping the driver; and a copy light emitting element and a dummy light emitting element disposed in the second display area and electrically connected to the boundary light emitting element.

20 Claims, 9 Drawing Sheets

(56) References Cited

U.S. PATENT DOCUMENTS

| | | |
|---|---|---|
| 10,147,777 B2 | 12/2018 | Lim et al. |
| 11,251,235 B2 | 2/2022 | Yoon et al. |
| 11,678,555 B2 | 6/2023 | Chung et al. |
| 11,723,238 B2 | 8/2023 | Kim et al. |
| 2015/0123884 A1* | 5/2015 | Kim .................... G09G 3/3208 345/82 |
| 2018/0097044 A1* | 4/2018 | Choi .................... H10K 77/111 |
| 2018/0122871 A1* | 5/2018 | Choi .................... G06F 3/0445 |
| 2019/0181200 A1* | 6/2019 | Jung .................... H10K 50/805 |
| 2020/0176526 A1* | 6/2020 | Yoon .................... H10K 59/122 |
| 2020/0176527 A1* | 6/2020 | An ........................ G09G 3/3233 |
| 2021/0210584 A1* | 7/2021 | Youn .................... H10K 59/121 |
| 2022/0069033 A1* | 3/2022 | Kim ...................... H10K 59/88 |
| 2022/0199727 A1* | 6/2022 | Lee ....................... H10K 59/88 |
| 2022/0352280 A1* | 11/2022 | Park .................... G09G 3/3241 |

FOREIGN PATENT DOCUMENTS

| | | |
|---|---|---|
| KR | 10-2016-0017695 | 2/2016 |
| KR | 10-2018-0018960 | 2/2018 |
| KR | 10-2045733 | 12/2019 |
| KR | 10-2020-0066505 | 6/2020 |
| KR | 10-2021-0010716 | 1/2021 |
| KR | 10-2021-0022818 | 3/2021 |

* cited by examiner

DISPLAY DEVICE

CROSS-REFERENCE TO RELATED APPLICATION

This application claims priority from and the benefit of Korean Patent Application No. 10-2021-0056534, filed on Apr. 30, 2021, which is hereby incorporated by reference for all purposes as if fully set forth herein.

BACKGROUND

Field

Embodiments of the invention relate generally to a display device, and more particularly, to a display device in which a light emitting element is also disposed on a driver.

Discussion of the Background

A display device may include a display area in which an image is displayed and a peripheral area in which an image is not displayed around the display area. Pixels may be arranged in the display area, and images may be displayed by a combination of the pixels. Various elements such as transistors and capacitors and wires for supplying signals to these elements may be positioned in a pixel area corresponding to each of the pixels. A driver (e.g., a gate driver, a data driver, a timing controller, etc.) generating signals applied to the pixels may be positioned in the peripheral area.

Reducing the peripheral area of the display device may increase a screen-to-body ratio of the display device. The screen-to-body ratio reflects a technical level of the display device, and at the same time, it may be an important factor for a consumer to select a product. High-speed driving (e.g., a scan rate of 120 Hz or higher) may be advantageous in order to increase display quality (image quality), and to this end, an area occupied by the driver increases, so it may be difficult to reduce a surrounding area.

The above information disclosed in this Background section is only for understanding of the background of the inventive concepts, and, therefore, it may contain information that does not form the prior art.

SUMMARY

Embodiments include a display device having an increased aspect ratio.

Additional features of the inventive concepts will be set forth in the description which follows, and in part will be apparent from the description, or may be learned by practice of the inventive concepts.

An embodiment provides a display device including a first display area; a second display area disposed adjacent to the first display area; a driver at least partially disposed in the second display area; a plurality of first light emitting elements disposed in the first display area; a plurality of second light emitting elements disposed in the second display area and including a boundary light emitting element adjacent to the first display area and a driver light emitting element overlapping the driver; and a copy light emitting element and a dummy light emitting element disposed in the second display area and electrically connected to the boundary light emitting element.

The boundary light emitting element and the copy light emitting element may each include an emission layer, and the dummy light emitting element may not include an emission layer.

The boundary light emitting element, the copy light emitting element, and the dummy light emitting element may each include a first electrode and a second electrode overlapping each other. First electrodes of the boundary light emitting element, the copy light emitting element, and the dummy light emitting element may be electrically connected to each other, and second electrodes of the boundary light emitting element, the copy light emitting element, and the dummy light emitting element may be electrically connected to each other.

The boundary light emitting element, the copy light emitting element, and the dummy light emitting element may each include a first common layer and a second common layer between the first electrode and the second electrode, The emission layer may be disposed between the first common layer and the second common layer of the boundary light emitting element and the copy light emitting element, and the first common layer and the second common layer of the dummy light emitting element may be in contact with each other.

The boundary light emitting element, the copy light emitting element, and the dummy light emitting element may be disposed between the plurality of first light emitting elements and the driving unit light emitting element.

The boundary light emitting element and the copy light emitting element may display a same color.

The display device may further include a plurality of first pixel circuit units disposed in the first display area and electrically connected to the plurality of first light emitting elements; and a plurality of second pixel circuit units disposed in the first display area and electrically connected to the plurality of second light emitting elements. The copy light emitting element and the dummy light emitting element may not overlap a second pixel circuit unit that is electrically connected thereto.

The boundary light emitting element may overlap a second pixel circuit unit that is electrically connected thereto.

The driver light emitting element may not overlap a second pixel circuit unit that is electrically connected thereto.

The boundary light emitting element may have a same size as a first light emitting element displaying a same color among the plurality of first light emitting elements.

The boundary light emitting element may have a smaller size than the driver light emitting element.

The copy light emitting element may have a same size as that of the boundary light emitting element.

The plurality of second light emitting elements may be arranged in a matrix form, the copy light emitting element may be arranged in a same row as the boundary light emitting element, and the dummy light emitting element may be arranged in a row that is different from that of the boundary light emitting element.

The dummy light emitting element may be disposed between two second light emitting elements displaying a color that is different from a color displayed by the boundary light emitting element.

The boundary light emitting element may display blue or red, and the two second light emitting elements displaying the different color may display green.

The first display area may include a rounded corner portion, and the boundary light emitting element may be adjacent to the corner portion.

The plurality of second light emitting elements may include a second light emitting element electrically connected to a plurality of copy light emitting elements.

An embodiment provides a display device including a first display area; a second display area disposed adjacent to the first display area; a plurality of first light emitting elements disposed in the first display area; a plurality of second light emitting elements disposed in the second display area; a dummy light emitting element disposed in the second display area and electrically connected to one of the plurality of second light emitting elements; and a driver at least partially disposed in the second display area.

The dummy light emitting element may include a first electrode and a second electrode overlapping each other, and may not include an emission layer between the first electrode and the second electrode.

A second light emitting element connected to the dummy light emitting element among the plurality of second light emitting elements may have a smaller size than a second light emitting element overlapping the driver among the plurality of second light emitting element and may have a same size as the first light emitting element.

According to the embodiments, it is possible to provide a display device capable of maintaining or improving display quality while having an increased screen ratio. In addition, according to the embodiments, there are other advantageous effects that can be recognized throughout the specification.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
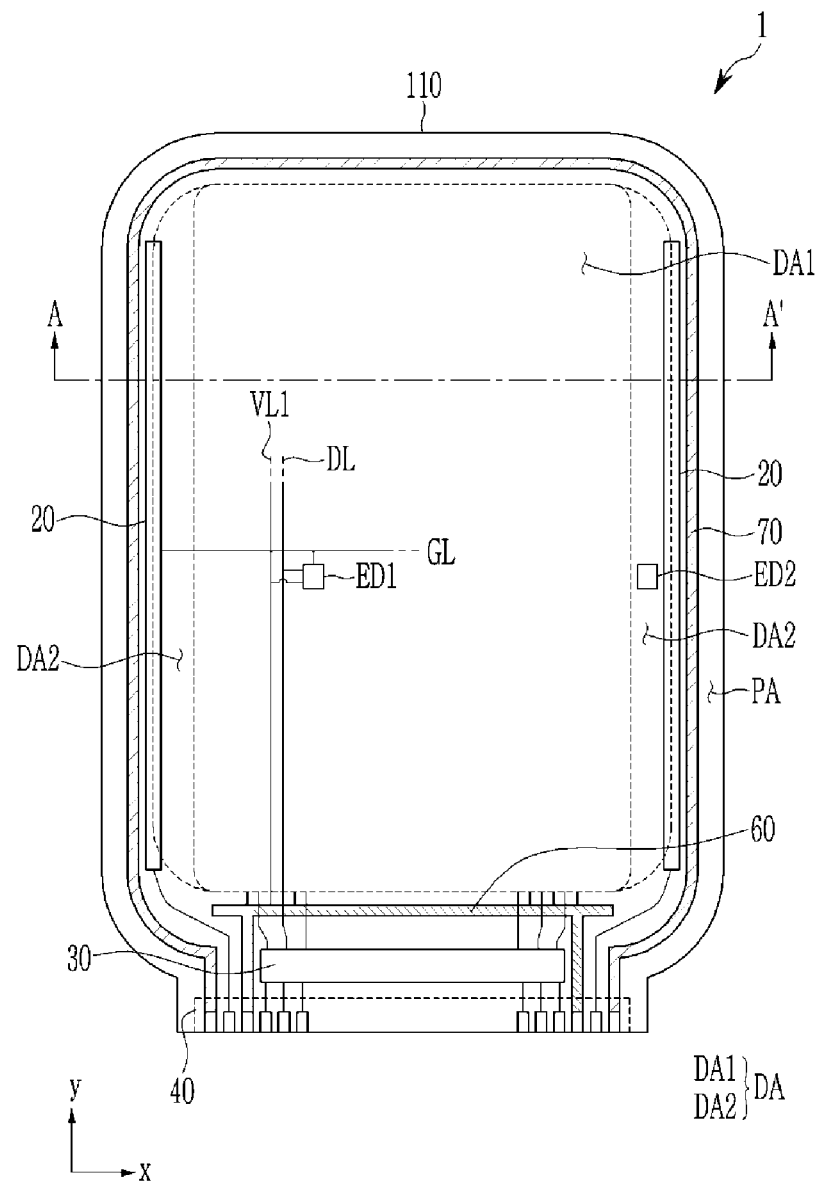
FIG. 1 is a schematic top plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system and may be interpreted in a broader sense. For example, the x-axis, the y-axis, and the z-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
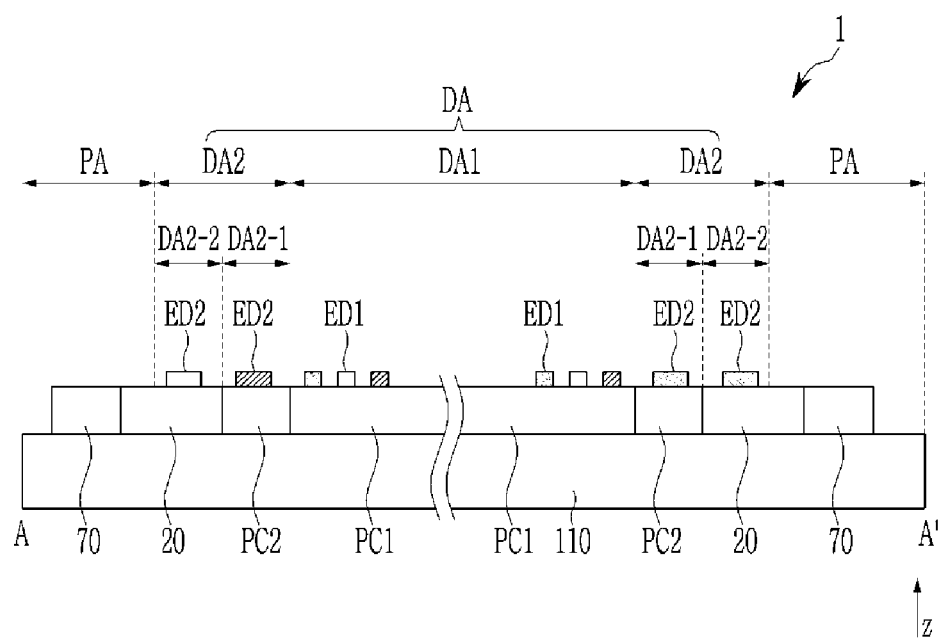
FIG. 2 is a schematic cross-sectional view taken along a line A-A' of FIG. 1 according to an embodiment.

FIG. 1 is a schematic top plan view illustrating a display device according to an embodiment, and FIG. 2 is a schematic cross-sectional view taken along a line A-A' of FIG. 1 according to an embodiment.

Referring to FIG. 1 and FIG. 2, the display device 1 may include a substrate 110 and light emitting elements ED1 and ED2 positioned on the substrate 110.

The substrate 110 includes a display area DA and a peripheral area PA. The display area DA and the peripheral area PA of the substrate 110 may respectively correspond to the display area and the peripheral area of the display device 1.

The display area DA may correspond to a screen on which an image is displayed. The display area DA may have a substantially rectangular shape, and a corner thereof may be rounded. A shape of the display area DA may be variously changed.

The display area DA may include a first display area DA1 and a second display area DA2. The first display area DA1 may occupy most of the display area DA. The second display area DA2 may be adjacent to the first display area DA1. The second display area DA2 may be positioned at opposite sides of the first display area DA1. Unlike the drawing, the second display area DA2 may surround the first display area DA1.

The periphery area PA may surround the display area DA. The peripheral area PA, which is an area in which an image is not displayed, may be positioned at an outer portion of the display device. Circuits and signal lines configured to generate and/or transmit various signals applied to the display area DA may be positioned in the peripheral area PA.

The light emitting elements ED1 and ED2 may be positioned in the display area DA. Signal lines DL, GL, and VL1 may be electrically connected to the light emitting elements ED1 and ED2. Each of the light emitting elements ED1 and ED2 may correspond to a pixel, and may emit red, green, or blue light. The display area DA may provide a predetermined image through a combination of light emitted from the light emitting elements ED1 and ED2.

The light emitting elements ED1 and ED2 may include first light emitting elements ED1 and second light emitting elements ED2. The first light emitting elements ED1 may be positioned in the first display area DA1, and the second light emitting elements ED2 may be positioned in the second display area DA2. In the first display area DA1, the first light emitting elements ED1 may be positioned along a first direction x and the second direction y, and in the second display area DA2, the second light emitting elements ED2 may be positioned along the first direction x and the second direction y. Sizes of the first light emitting elements ED1 and the second light emitting elements ED2 may be the same or different. For example, the second light emitting elements ED2 may be larger than the first light emitting elements ED1. In the present specification, size comparison between the first light emitting elements ED1 and the second light emitting elements ED2 is a comparison of light emitting elements displaying the same color. In this specification, the size of the light emitting elements may indicate an area of the light emitting elements, and the size and area may be used interchangeably. A number of first light emitting elements ED1 per unit area and a number of second light emitting elements ED2 per unit area may be the same or different. For example, a number of second light emitting elements ED2 per unit area may be smaller than of first light emitting elements ED1 per unit area. Resolutions of the first display area DA1 and the second display area DA2 may be the same or different. For example, a resolution of the first display area DA1 may be higher than that of the second display area DA2. The disposals, sizes, and resolutions of the first light emitting elements ED1 and the second light emitting elements ED2 may be variously changed.

The display device 1 may further include pixel circuit units PC1 and PC2 positioned on the substrate 110. The pixel circuit units PC1 and PC2 may include first pixel circuit units PC1 and second pixel circuit units PC2. The first pixel circuit units PC1 may be positioned in the first display area DA1, and the second pixel circuit units PC2 may be positioned in the second display area DA2. The first pixel circuit units PC1 may be connected to the first light emitting elements ED1, and the second pixel circuit units PC2 may be connected to the second light emitting elements ED2. One first pixel circuit unit PC1 may be connected to one first light emitting element ED1, and one second pixel circuit unit PC2 may be connected to one second light emitting element ED2.

An area of one first pixel circuit unit PC1 may be different from an area of one second pixel circuit unit PC2. For example, the first pixel circuit unit PC1 and the second pixel circuit unit PC2 may have a same length and different widths. The first pixel circuit unit PC1 and the second pixel circuit unit PC2 may have the same width and different lengths. Both the length and width of the first pixel circuit unit PC1 and the second pixel circuit unit PC2 may be different. The area of the second pixel circuit unit PC2 may be larger than that of the first pixel circuit unit PC1. For example, the area of the second pixel circuit unit PC2 may be approximately twice the area of the first pixel circuit unit PC1.

In the peripheral area PA, a pad portion 40 may be positioned along one edge of the substrate 110. The pad portion 40 may include pads configured to receive signals from the outside. A flexible printed circuit film (not illustrated) may be bonded to the pad portion 40, and pads of the flexible printed circuit film may be electrically connected to the pads of the pad portion 40.

The display device 1 may include a driver that generates and/or processes various signals configured to drive the light emitting elements ED1 and ED2. The driver may include a data driver configured to apply a data voltage to the pixel circuit units PC1 and PC2 through data lines DL, a gate driver 20 configured to apply a gate signal to the pixel circuit units PC1 and PC2 through gate lines GL, and a signal controller configured to control the data driver and the gate driver 20.

The gate driver 20 may be integrated on the substrate 110, and may be positioned at opposite sides (or one side) of the first display area DA1. At least a portion of the gate driver 20 may be positioned in the second display area DA2. For example, a portion of the gate driver 20 may be positioned in the second display area DA2, and the other portion may be positioned in the peripheral area PA. For example, the gate driver 20 may include a scan signal generator, an inverted scan signal generator, an initialization control signal generator, a bypass control signal generator, and/or an emission control signal generator.

The data driver and the signal controller may be provided as an integrated circuit chip (also referred to as a driving IC chip) 30, and the integrated circuit chip 30 may be mounted in the peripheral area PA. The integrated circuit chip 30 may be mounted on a flexible printed circuit film or the like and electrically connected to the pad portion 40.

The display device 1 may include a driving voltage supply line 60 and a common voltage supply line 70. The driving voltage supply line 60 may be positioned between the pad portion 40 and the display area DA in the peripheral area PA. The driving voltage supply line 60 may provide a driving voltage to the pixel circuit units PC1 and PC2 through driving voltage lines VL1. The common voltage supply line 70 may be positioned in the peripheral area PA, and may surround at least a portion of the display area DA. The common voltage supply line 70 may provide a common voltage to one electrode of the light emitting elements ED1 and ED2.

The disposal of the light emitting elements ED1 and ED2 and the pixel circuit units PC1 and PC2 will be described in more detail.

The first pixel circuit units PC1 and the first light emitting elements ED1 receiving an emission current from the first pixel circuit units PC1 are positioned in the first display area DA1. In other words, an area from which light is emitted by the first light emitting elements ED1 is the first display area DA1. The first light emitting element ED1 may overlap the first pixel circuit unit PC1 that is electrically connected thereto to provide a light emitting current.

Hereinafter, one first pixel circuit unit PC1 and one first light emitting element ED1 receiving an emission current therefrom are collectively referred to as a pixel or a normal pixel in the first display area. The first pixel circuit unit PC1 and the first light emitting element ED1 are also referred to as a normal pixel circuit unit and a normal light emitting element, respectively.

The second pixel circuit units PC2 and the second light emitting elements ED2 receiving an emission current from the first pixel circuit units PC2 are positioned in the second display area DA2. In other words, an area from which light is emitted by the second light emitting elements ED2 is the second display area DA2. The second light emitting element ED2 may or may not overlap the second pixel circuit unit PC2 that is electrically connected thereto to provide an emission current.

It may be divided into a $2\text{-}1^{st}$ display area DA2-1 where the second pixel circuit units PC2 are positioned and a $2\text{-}2^{nd}$ display area DA2-2 where the gate driver 20 is positioned. The second light emitting elements ED2 receiving emission currents from the second pixel circuit units PC2 are positioned in the $2\text{-}1^{st}$ display area DA2-1 and the $2\text{-}2^{nd}$ display area DA2-2. The second light emitting elements ED2 positioned in the $2\text{-}1^{st}$ display area DA2-1 and the second light emitting elements ED2 positioned in the $2\text{-}2^{nd}$ display area DA2-2 all may receive emission currents from the second pixel circuit units PC2 positioned in the $2\text{-}1^{st}$ display area DA2-1. Accordingly, the second pixel circuit units PC2 may include second pixel circuit units PC2 that transmit a light emitting current to the second light emitting elements ED2 of the $2\text{-}1^{st}$ display area DA2-1, and second pixel circuit units PC2 that transfer a light emitting current to the second light emitting elements ED2 of the $2\text{-}2^{nd}$ second display area DA2-2.

Hereinafter, one second pixel circuit unit PC2 and one second light emitting element ED2 receiving an emission current therefrom are collectively referred to as a pixel or a modified pixel in the second display area. The second pixel circuit unit PC2 and second light emitting element ED2 are also referred to as a modified pixel circuit unit and a modified light emitting element, respectively. The second light emitting element ED2 positioned in the $2\text{-}1^{st}$ display area DA2-1 is referred to as a $2\text{-}1^{st}$ light emitting element or an intermediate light emitting element, and the second light emitting element ED2 positioned in the $2\text{-}2^{nd}$ display area DA2-2 is referred to as a $2\text{-}2^{nd}$ light emitting element or a driver light emitting element.

In a typical display device, light emitting elements are positioned on pixel circuits, and no light emitting elements are positioned on drivers such as gate drivers. According to an embodiment, some of the second light emitting elements ED2 may be positioned in an area overlapping the gate driver 20, thereby expanding the display area and increasing the screen ratio. Meanwhile, the second light emitting elements ED2 may overlap other drivers or signal lines in addition to the gate driver 20.

Figure 3:
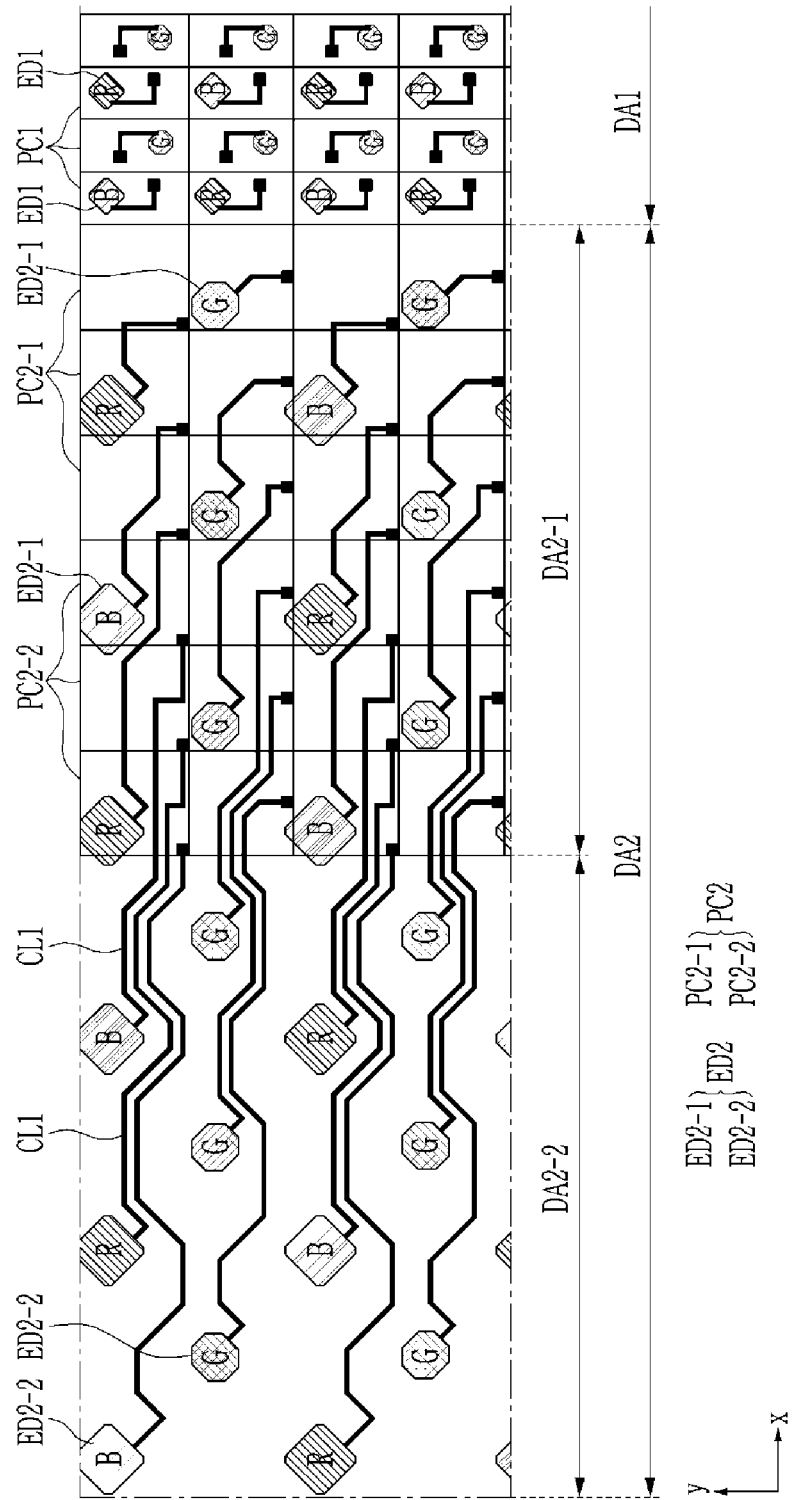
FIG. 3 is a top plan view illustrating a connection relationship between pixel circuit units and light emitting elements in a display device according to an embodiment.

FIG. 3 is a top plan view illustrating a connection relationship between pixel circuit units and light emitting elements in a display device according to an embodiment.

In the first display area DA1, the first pixel circuit units PC1 may be arranged in a matrix form, and the first light emitting elements ED1 may also be arranged in a matrix form along a first direction x and a second direction y. The first pixel circuit units PC1 and the first light emitting elements ED1 may correspond to each other one-to-one. The first light emitting element ED1 may be electrically connected to the corresponding first pixel circuit unit PC1 to receive an emission current. The first light emitting element ED1 may overlap the corresponding first pixel circuit unit PC1.

Each of the first light emitting elements ED1 may display any one color of a first color, a second color, and a third color. For example, the first light emitting element ED1 may display red (R), green (G), or blue (B). In the illustrated embodiment, the first light emitting element ED1 that displays blue (B), the first light emitting element ED1 displaying green (G), the first light emitting element ED1 displaying red (R), and the first light emitting element ED1 displaying green (G) may be repeatedly arranged in odd rows in the first direction x. The first light emitting element ED1 displaying red (R), the first light emitting element ED1 displaying green (G), the first light emitting element ED1 displaying blue (B), and the first light emitting element ED1 displaying green (G) may be repeatedly arranged in even rows in the first direction x.

In the second display area DA2, the second light emitting elements ED2 may be arranged in a matrix form along the first direction x and the second direction y. The second light emitting elements ED2 may correspond to the second pixel circuit units PC2 one-to-one. The second light emitting element ED2 may be electrically connected to the corresponding second pixel circuit unit PC2 to receive an emission current.

Each of the second light emitting elements ED2 may display any one color of a first color, a second color, and a third color. For example, the second light emitting element ED2 may display red (R), green (G), or blue (B). In the illustrated embodiment, the second light emitting element ED2 displaying blue (B) and the second light emitting element ED2 displaying red (R) are repeatedly arranged in odd rows in the first direction x. The second light emitting elements ED2 displaying green (G) may be arranged in even rows.

The second light emitting elements ED2 may include 2-1$^{st}$ light emitting elements ED2-1 and 2-2$^{nd}$ light emitting elements ED2-2. The second display area DA2 may include a 2-1$^{st}$ display area DA2-1 and a 2-2$^{nd}$ display area DA2-1. The 2-1$^{st}$ display area DA2-1 may be positioned between the first display area DA and the 2-2$^{nd}$ display area DA2-2.

The second pixel circuit units PC2 may be positioned in the 2-1$^{st}$ display area DA2-1, and the gate driver 20 may be positioned in the 2-2$^{nd}$ display area DA2-2. The second pixel circuit units PC2 may be arranged in a matrix form along the first direction x and the second direction y in the 2-1$^{st}$ display area DA2-1. Because circuit units constituting the gate driver 20 are positioned in the 2-2$^{nd}$ display area DA2-2, the second pixel circuit units PC2 may be positioned only in the 2-1$^{st}$ display area DA2-1.

In the 2-1$^{st}$ display area DA2-1, the 2-1$^{st}$ light emitting elements ED2-1 that receive emission currents from some of the second pixel circuit units PC2 may be positioned. In the 2-2$^{nd}$ display area DA2-2, the 2-2$^{nd}$ light emitting elements ED2-2 receiving the emission current from some of the second pixel circuit units PC2 may be positioned. Hereinafter, the second pixel circuit units PC2 that transfer the emission current to the 2-1$^{st}$ light emitting elements ED2-1 are referred to as 2-1$^{st}$ pixel circuit units PC2-1 or pixel circuit units for intermediate light emitting elements, the second pixel circuit units PC2 that transmit the emission current to the 2-2$^{nd}$ light emitting elements ED2-2 are referred to as 2-2$^{nd}$ pixel circuit units PC2-2 or pixel circuit units for driver light emitting elements. The 2-1$^{st}$ pixel circuit units PC2-1 may be positioned closer to the first display area DA than the 2-2$^{nd}$ pixel circuit units PC2-2.

The 2-1$^{st}$ light emitting elements ED2-1 may or may not overlap the corresponding 2-1$^{st}$ pixel circuit units PC2-1. In the illustrated embodiment, the 2-1$^{st}$ light emitting element ED2-1 positioned in an even-numbered row in a column that is adjacent to the first display area DA1 overlaps the corresponding 2-1$^{st}$ pixel circuit unit PC2-1, and the other 2-1$^{st}$ light emitting elements ED2-1 do not overlap the corresponding 2-1$^{st}$ pixel circuit units PC2-1. The other 2-1$^{st}$ light emitting elements ED2-1 may overlap non-corresponding (i.e., not electrically connected thereto) 2-1$^{st}$ pixel circuit units PC2-1 or 2-2$^{nd}$ pixel circuit units PC2-2. The 2-2$^{nd}$ light emitting elements ED2-2 may not overlap the corresponding 2-2$^{nd}$ pixel circuit units PC2-2.

The second light emitting element ED2 that does not overlap the corresponding second pixel circuit unit PC2 may be electrically connected to the corresponding second pixel circuit unit PC2 by a connection line CL1 to receive a driving current.

An area of the second pixel circuit unit PC2 positioned at the 2-1$^{st}$ display area DA2-1 may be about 2 to 4 times an area of the first pixel circuit unit PC1 positioned at the first display area DA1. In the illustrated embodiment an area of the second pixel circuit unit PC2 is approximately twice an area of the first pixel circuit unit PC1. The area of the second pixel circuit unit PC2 and the area of the first pixel circuit unit PC1 may be substantially the same.

An area of the second light emitting element ED2 may be larger than that of the first light emitting element ED1, and for example, about 1 to 2 times. The areas of the second light emitting element ED2 and the first light emitting element ED1 may be substantially the same. Herein, the areas of the light emitting elements ED1 and ED2 may refer to areas in which light is emitted. This is because the light emitting element displaying the first color may have a different area from the light emitting element displaying the second color or the third color. For example, a light emitting element displaying blue (B) or red (R) may be larger than a light emitting element displaying green (G). The light emitting element displaying blue (B) may be the same as or larger than the light emitting element displaying red (R).

As the second light emitting elements ED2 are positioned not only in an area where the second pixel circuit units PC2 are positioned but also in an area where the gate driver 20 is positioned, the display area DA may be expanded. However, a pixel density of the second display area DA2 may be lower than that of the first display area DA1. Luminance of the second light emitting elements ED2 may be increased by increasing the area of the second light emitting elements ED2 in order to compensate for the relatively low pixel density of the second display area DA2. A greater current may be supplied to the second light emitting elements ED2 in order to increase the luminance of the second light emitting elements ED2, and to this end, elements such as a storage capacitor included in the second pixel circuit unit PC2 may be formed to be larger. Accordingly, the area of the second pixel circuit unit PC2 may be wider than that of the first pixel circuit unit PC1. The areas of the second pixel circuit unit PC2 and the second light-emitting device ED2 may be set in various ways.

Figure 4:
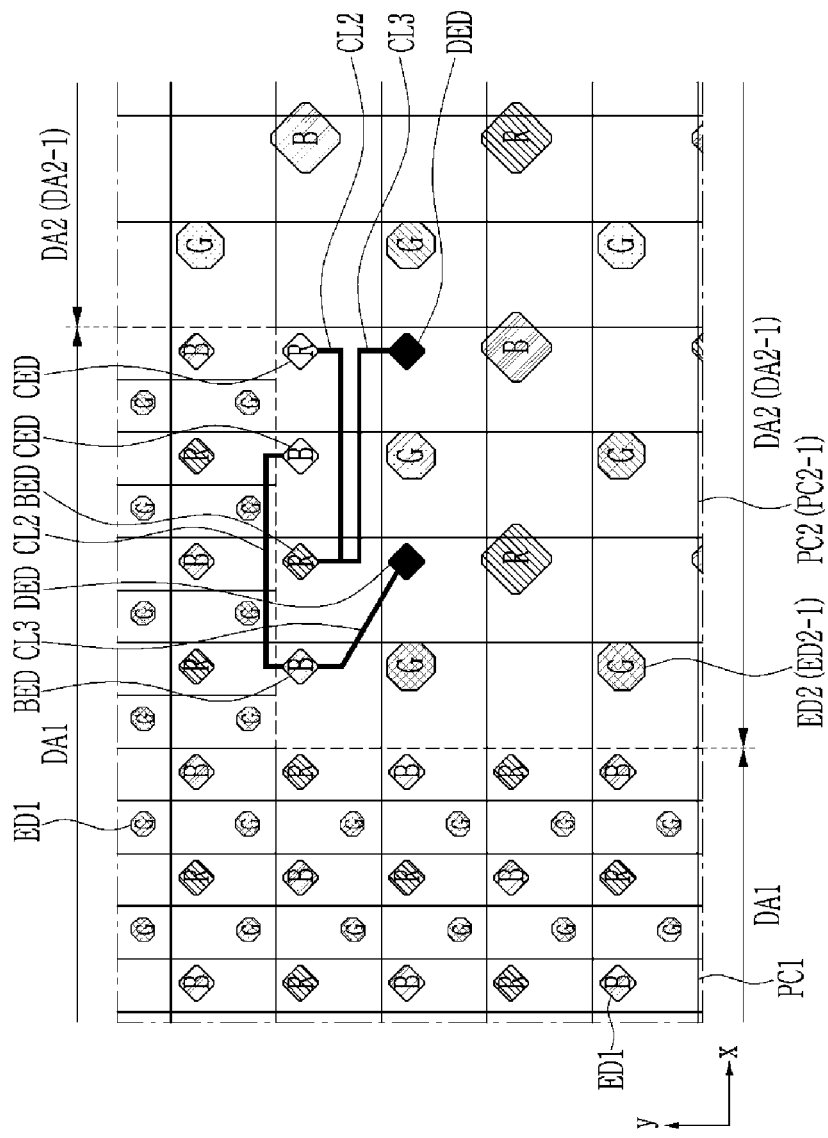
FIG. 4 is a top plan view illustrating a disposal of light emitting elements in a display device according to an embodiment.

FIG. 4 is a top plan view illustrating a disposal of light emitting elements in a display device according to an embodiment.

FIG. 4 illustrates disposal of light emitting elements in a corner portion of the display area DA. An area illustrated in FIG. 4 may correspond to a lower right corner of the display area DA illustrated in FIG. 1. A corner of the first display area DA1 may have a rounded edge, but the edge of the corner may be stepped on a pixel-level scale. Accordingly, a boundary between the first display area DA1 and the second display area DA2 may have a stepped shape. In FIG. 4, the boundary between the first display area DA1 and the second display area DA2 is indicated by a dotted line. In order to avoid complication of the drawing, the connection line CL1 connecting the second light emitting element ED2 and the second pixel circuit unit PC2 illustrated in FIG. 3 is not illustrated.

Emission layers of the light emitting elements ED1 and ED2 may be formed by a deposition process using a fine metal mask. As described above, although the area of the second light emitting elements ED2 positioned in the second display area DA2 may be larger than that of the first light emitting elements ED1 positioned in the first display area DA1, it may be difficult to form a large metal mask due to a manufacturing tolerance in a portion of the corner portion. Accordingly, some of the second light emitting elements ED2, e.g., the second light emitting element ED2 adjacent to the corner of the first display area DA1, may be formed to have a same size as the first light emitting element ED1. Hereinafter, the second light emitting element ED2, which may have the same size as the first light emitting element ED1, is referred to as a boundary light emitting element BED to distinguish it from other second light emitting elements ED2. The boundary light emitting element BED may have a smaller size than other second light emitting elements ED2.

A copy light emitting element CED electrically connected to the boundary light emitting element BED may be positioned near the boundary light emitting element BED in the second display area DA2 in order to compensate for a decrease in luminance due to a decrease in size compared to the other second light emitting elements ED2. A first electrode and a second electrode of the copy light emitting element CED may be electrically connected to a first electrode and a second electrode of the boundary light emitting element BED, respectively. The first electrode of the copy light emitting element CED may be connected to the first electrode of the boundary light emitting element BED by a connection line CL2. The copy light emitting element CED may simultaneously emit light of a same color as that of the boundary light emitting element BED. A size of the copy light emitting element CED may be the same as or different from that of the boundary light emitting element BED. A shape of the copy light emitting element CED may be the same as or different from that of the boundary light emitting element BED.

The boundary light emitting element EBD displaying the first color and the copy light emitting element CED connected thereto may be arranged along the first direction x, which is a row direction. The boundary light emitting element BED displaying the second color may be positioned between the boundary light emitting element EBD displaying the first color and the copy light emitting element CED connected thereto. In the illustrated embodiment, the boundary light emitting element BED displaying blue (B), the boundary light emitting element BED displaying red (R), the copy light emitting element CED displaying blue (B), and the copy light emitting element CED displaying red (R) are arranged in a same row in the first direction x. Such a disposal may be repeated along the first direction x depending on a design.

The boundary light emitting element BED and the copy light emitting element CED may receive an emission current from the corresponding second pixel circuit unit PC2. Although the current from the second pixel circuit unit PC2 is distributed to the boundary light emitting element BED and the copy light emitting element CED, the boundary light emitting element BED and the copy light emitting element CED are formed to have a same size as the first light emitting element ED1, and thus current density thereof may be higher than that of the other second light emitting element ED2. An increase in current density may result in an increase in luminance of the boundary light emitting element BED and the copy light emitting element CED.

To reduce the current density, a dummy light emitting element DED electrically connected to the boundary light emitting element BED may be positioned in the second display area DA2. A first electrode and a second electrode of the dummy light emitting element DED may be electrically connected to a first electrode and a second electrode of the boundary light emitting element BED, respectively. The first electrode of the dummy light emitting element DED may be connected to the first electrode of the boundary light emitting element BED by a connection line CL3.

The dummy light emitting element DED is an element that receives a current from the second pixel circuit unit PC2 but does not emit light. To this end, the dummy light emitting element DED may not include an emission layer in a typical light emitting element. For example, the light emitting elements ED1 and ED2 may include an emission layer and common layers (e.g., a hole injection layer, a hole transport layer, an electron blocking layer, a hole blocking layer, an electron injection layer, and/or an electron transport layer) positioned between the first electrode and the second electrode, while the dummy light emitting element DED may include common layers positioned between the first and second electrodes and no emission layer. The dummy light emitting element DED may not include an emission layer and some of the common layers. With such a structure, the dummy light emitting element DED may not emit light, and may function as a resistor to which current is distributed.

The dummy light emitting element DED may have a same size as or different from that of the boundary light emitting element BED. For example, the dummy light emitting element DED may have a size of about 1 to 2 times that of the boundary light emitting element BED. For example, the size of the dummy light emitting element DED may be about 1.3 times the size of the boundary light emitting element BED. A size of the dummy light emitting element DED may be designed to adjust a current density in consideration of an output current of the second pixel circuit unit PC2 and sizes of the boundary light emitting element BED and the copy light emitting element CED.

The dummy light emitting element DED may be positioned in consideration of a disposal of the second light emitting elements ED2. The dummy light emitting element DED may be positioned between the second light emitting elements ED2 in different rows. For example, when the boundary light emitting element BED displays blue (B) or red (R), the corresponding dummy light emitting element DED may be positioned between the second light emitting elements ED2 displaying green (G).

The boundary light emitting element BED may or may not overlap the corresponding second pixel circuit unit PC2.

The copy light emitting element CED and the dummy light emitting element DED may not overlap the corresponding second pixel circuit unit PC2 (i.e., electrically connected), and may also overlap the second pixel circuit unit PC2 that is electrically connected to another second light emitting element ED2.

The boundary light emitting element BED, the copy light emitting element CED, and the dummy light emitting element DED may be positioned to not overlap the gate driver 20. That is, the boundary light emitting element BED, the copy light emitting element CED, and the dummy light emitting element DED may be positioned in the 2-1$^{st}$ display area DA2-1. The boundary light emitting element BED, the copy light emitting element CED, and the dummy light emitting element DED may be positioned between the first light emitting elements ED1 and the 2-2$^{nd}$ second light emitting elements ED2-2.

Figure 5:
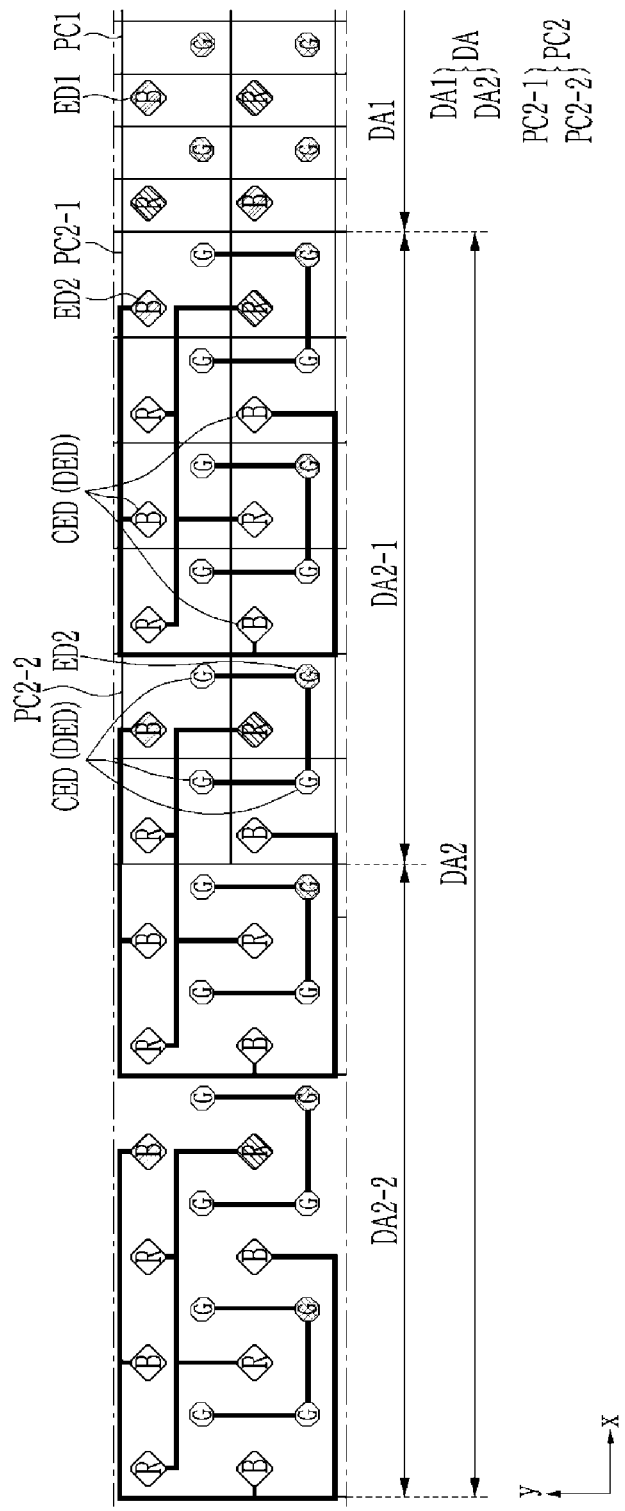
FIG. 5 is a top plan view illustrating a disposal of light emitting elements in a display device according to an embodiment.

FIG. 5 is a top plan view illustrating a disposal of light emitting elements in a display device according to an embodiment.

FIG. 5 illustrates an example in which four light emitting elements are electrically connected in the second display area DA2. One of the four light emitting elements may be a second light emitting element ED2 such as the above-described boundary light emitting element BED, and the other three may be copy light emitting elements CED. For example, a rightmost light emitting element may be the second light emitting element ED2 that is connected to the second pixel circuit unit PC2 through a connection line, and the other light emitting elements may be copy light emitting elements CED connected to the second light emitting element ED2 among the four light emitting elements. As described above, a plurality of copy light emitting elements CED may be connected to one second light emitting element ED2. A number of copy light emitting elements CED connected to one second light emitting element ED2 may be less than or more than four. The size of the copy light emitting element CED may be the same as or different from that of the corresponding second light emitting element ED2. At least one of the copy light emitting elements CED may be a dummy light emitting element DED without an emission layer.

A size of the second light emitting element ED2 illustrated in FIG. 5 may be the same as that of the first light emitting element ED1, but may be different therefrom. The copy light emitting elements CED may have a same size as the corresponding second light emitting elements ED2, but may be different therefrom. The copy light emitting elements CED may have a same size or different sizes.

As such, when the light emitting elements in the second display area DA2 are formed, a pixel structure having a same current density corresponding to a shape of the display area DA may be manufactured. In addition, the dummy light emitting elements DED may be positioned in a portion of the display area DA as desired, such as a corner portion, to adjust a current density and adjust luminance. When the light emitting elements are formed throughout the second display area DA2 as illustrated, a pattern of a fine metal mask may be designed to be substantially the same in the first display area DA1 and the second display area DA2.

Figure 6:
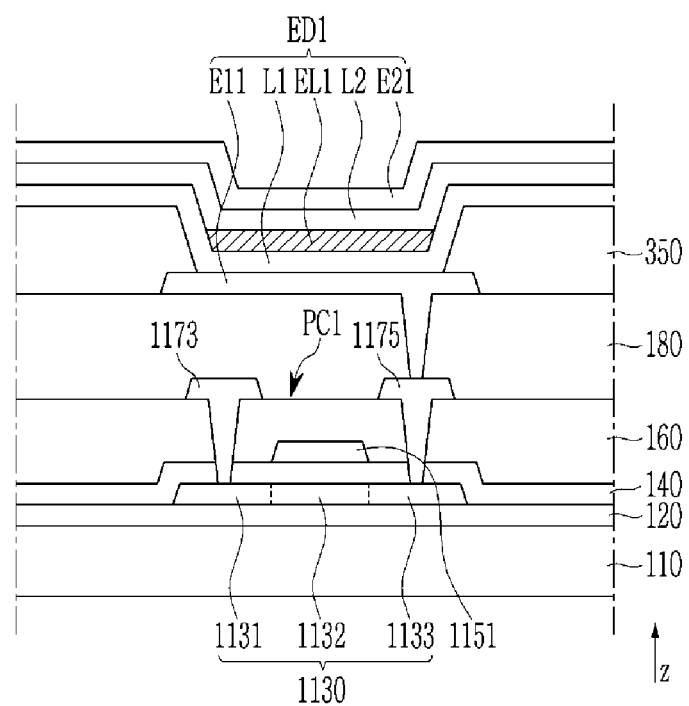
FIG. 6 is a schematic cross-sectional view illustrating a first pixel circuit unit and a first light emitting element according to an embodiment.
Figure 7:
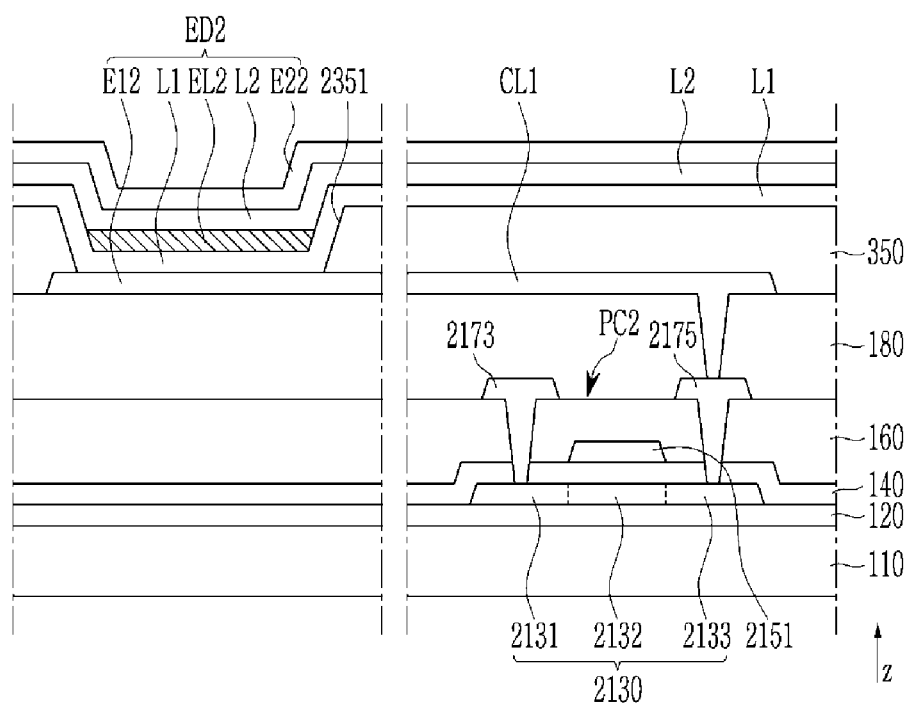
FIG. 7 is a cross-sectional view illustrating a second pixel circuit unit and a second light emitting element according to an embodiment.
Figure 8:
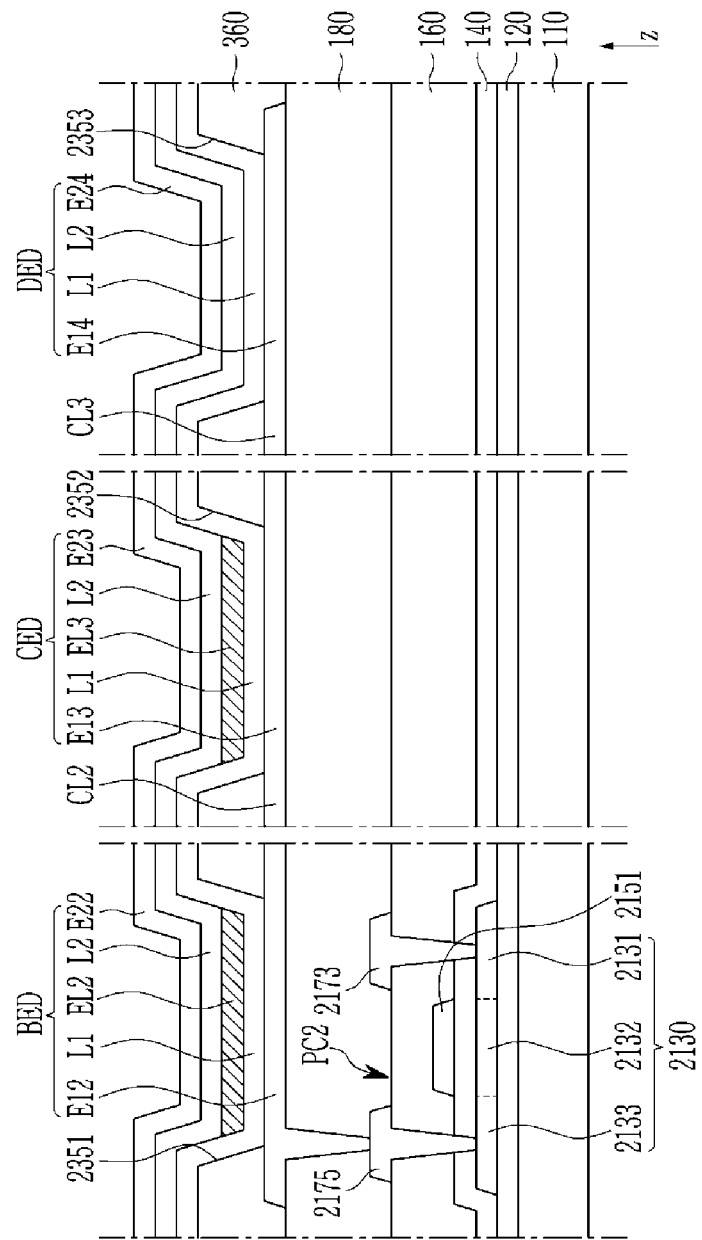
FIG. 8 is a schematic cross-sectional view illustrating a second pixel circuit unit, a boundary light emitting element, a copy light emitting element, and a dummy light emitting element in a display device according to an embodiment.

FIG. 6 is a schematic cross-sectional view illustrating a first pixel circuit unit and a first light emitting element according to an embodiment, FIG. 7 is a cross-sectional view illustrating a second pixel circuit unit and a second light emitting element according to an embodiment, and FIG. 8 is a schematic cross-sectional view illustrating a second pixel circuit unit, a boundary light emitting element, a copy light emitting element, and a dummy light emitting element in a display device according to an embodiment.

Referring to FIG. 6, FIG. 7, and FIG. 8, the display device may include a substrate 110 and layers and elements positioned thereon.

The substrate 110 may be a flexible substrate including a polymer layer made of, e.g., a polyimide, a polyamide, and polyethylene terephthalate. The substrate 110 may include a barrier layer configured to prevent moisture, oxygen, etc. from penetrating. For example, the substrate 110 may include one or more polymer layers and one or more barrier layers, and the polymer layers and the barrier layers may be alternately stacked. The substrate 110 may be a rigid substrate including glass or the like.

A buffer layer 120 may be disposed on the substrate 110. The buffer layer 120 may improve the characteristics of the semiconductor layer by blocking impurities from the substrate 110 when the semiconductor layer is formed, and may flatten a surface of the substrate 110 to relieve a stress of the semiconductor layer. The buffer layer 120 may include an inorganic insulating material such as a silicon nitride ($SiN_x$), a silicon oxide ($SiO_x$), and a silicon oxynitride ($SiO_xN_y$), and may be a single layer or multiple layers. The buffer layer 120 may include amorphous silicon (Si).

A semiconductor layer including a first semiconductor layer 1130 of the first pixel circuit unit PC1 and a second semiconductor layer 2130 of the second pixel circuit unit PC2 may be positioned on the buffer layer 120. The first semiconductor layer 1130 may include a first region 1131, a channel region 1132, and a second region 1133, and the second semiconductor layer 2130 may include a first region 2131, a channel region 2132, and a second region 2133. The semiconductor layer may include any one of amorphous silicon, polysilicon, and an oxide semiconductor. For example, the semiconductor layer may include low temperature polysilicon (LTPS), and may include an oxide semiconductor material including at least one of zinc (Zn), indium (In), gallium (Ga), and tin (Sn). The first regions 1131 and 2131 and the second regions 1133 and 2133 may be conductive in the semiconductor layers 1130 and 2130. For example, hydrogen or the like may be implanted into the first regions 1131 and 2131 and the second regions 1133 and 2133.

A gate insulating layer 140 may be disposed on the semiconductor layer. The gate insulating layer 140 may include an inorganic insulating material such as a silicon nitride, a silicon oxide, and a silicon oxynitride, and may be a single layer or multiple layers.

A gate conductive layer including a gate electrode 1151 of the first pixel circuit unit PC1 and a gate electrode 2151 of the second pixel circuit unit PC2 may be positioned on the gate insulating layer 140. The gate electrode 1151 may overlap the channel region 1132 of the semiconductor layer 1130, and the gate electrode 2151 may overlap the channel region 2132 of the semiconductor layer 2130. The gate conductive layer may include molybdenum (Mo), aluminum (Al), copper (Cu), titanium (Ti), and the like, and may be a single layer or multiple layers.

An interlayer insulating layer 160 may be disposed on the gate conductive layer. The interlayer insulating layer 160 may include an inorganic insulating material such as a silicon nitride, a silicon oxide, and a silicon oxynitride, and may be a single layer or multiple layers.

A data conductive layer including a first electrode 1173 and a second electrode 1175 of the first pixel circuit unit PC1 and a first electrode 2173 and a second electrode 2175 of the second pixel circuit unit PC2 may be positioned on the interlayer insulating layer 160. When one of the first electrode 1173 (or 2173) and the second electrode 1175 (or 2175) is a source electrode, the other may be a drain electrode. The first electrode 1173 and the second electrode 1175 may be respectively connected to the first region 1131 and the second region 1133 of the semiconductor layer 1130 through contact holes formed in the interlayer insulating layer 160. The first electrode 2173 and the second electrode 2175 may be respectively connected to the first region 2131 and the second region 2133 of the semiconductor layer 2130 through contact holes formed in the interlayer insulating layer 160. The data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

The semiconductor layer 1130, The gate electrode 1151, the first electrode 1173, and the second electrode 1175 of the first pixel circuit unit PC1 may constitute a transistor. The semiconductor layer 2130, the gate electrode 2151, the first electrode 2173, and the second electrode 2175 of the second pixel circuit part PC2 may constitute a transistor.

A planarization layer 180 may be disposed on the data conductive layer. The planarization layer 180 may be an organic insulating layer. For example, the planarization layer 180 may contain polymethylmethacrylate, a general purpose polymer such as polystyrene, a polymer derivative having a phenolic group, an acrylic polymer, an imide-based polymer (e.g., a polyimide), and an organic insulating material such as a siloxane-based polymer. A passivation layer including an inorganic insulating material such as a silicon nitride, a silicon oxide, or a silicon oxynitride may be disposed between the data conductive layer and the planarization layer 180.

A first electrode E11 of the first light emitting element ED1 and a first electrode E12 of the second light emitting element ED2 may be positioned on the planarization layer 180. In addition, a first electrode E12 of the boundary light emitting element BED, a first electrode E13 of the copy light emitting element CED, and a first electrode E14 of the dummy light emitting element DED may be positioned on the planarization layer 180.

The first electrode E11 of the first light emitting element ED1 may be connected to the second electrode 1175 of the first pixel circuit unit PC1 through a contact hole formed in the planarization layer 180. The first electrode E12 of the second light emitting element ED2 may be connected to the connection line CL1, and the connection line CL1 may be connected to the second electrode 2175 of the second pixel circuit unit PC2 through a contact hole formed in the planarization layer 180. The connection line CL1 may be an extension of the first electrode E12. The connecting line CL1 may be formed of a conductor positioned on a layer that is different from that of the first electrode E12. The transistor TR to which the first electrode E11 and E12 are electrically connected may be a driving transistor or a transistor that is electrically connected to the driving transistor.

The first electrode E13 of the copy light emitting element CED may be connected to the connection line CL2, and the connection line CL2 may be connected to the first electrode E12 of the boundary light emitting element BED. The first electrode E14 of the dummy light emitting element DED may be connected to the connection line CL4, and the connection line CL4 may be connected to the first electrode E12 of the boundary light emitting element BED. The connection line CL2 may be an extension of the first electrode E13 and/or the first electrode E12, and the connection line CL3 may be an extension of the first electrode E14 and/or the first electrode E12. At least one of the connecting lines CL2 and CL3 may be formed of a conductor that is positioned on a layer different from that of the first electrode E12.

The first electrodes E11, E12, E13, and E14 may be referred to as pixel electrodes. The first electrodes E11, E12, E13, and E14 may be formed of a reflective conductive material or a semi-transmissive conductive material, or may be formed of a transparent conductive material. The first electrodes E11, E12, E13, and E14 may include a transparent conductive material such as an indium tin oxide (ITO) or an indium zinc oxide (IZO). The first electrodes E11, E12, E13, and E14 may include a metal such as lithium (Li), calcium (Ca), aluminum (Al), silver (Ag), magnesium (Mg), or gold (Au), or a metal alloy.

A pixel definition layer 350 having openings 1351, 2351, 2352, and 2353 overlapping the first electrodes E11, E12, E13, and E14 may be disposed on the planarization layer 180 and the first electrodes E11, E12, E13, and E14. The pixel definition layer 350 may be referred to as a partition wall. The pixel definition layer 350 may contain a general purpose polymer such as a polymer derivative having a phenolic group, an acrylic polymer, an imide-based polymer (e.g., a polyimide), and an organic insulating material such as a siloxane-based polymer.

A first common electrode L1 may be disposed on the first electrodes E11, E12, E13, and E14. The first common layer L1 may include a hole injection layer, a hole transport layer and/or an electron blocking layer.

The emission layer EL1 of the first light emitting element ED1 and the emission layer EL2 of the second light emitting element ED2 may be disposed on the first common layer L1. In addition, the emission layer EL2 of the boundary light emitting element BED and the emission layer EL3 of the copy light emitting element CED may be disposed on the first common layer L1. However, no emission layer of the dummy light emitting element DED is positioned. The emission layer EL1 may overlap the first electrode E11, the emission layer EL2 may overlap the first electrode E12, and the emission layer EL3 may overlap the first electrode E13. The emission layer EL2 of the boundary light emitting element BED and the emission layer EL3 of the copy light emitting element CED may be formed of same material, and may emit light of a same color.

A second common layer L2 may be disposed on the first common layer L1 with the emission layers EL1, EL2, and EL3 interposed therebetween. The second common layer L2 may include a hole blocking layer, an electron transport layer, and/or an electron injection layer. Because the dummy light emitting element DED does not include an emission layer, the second common layer L2 may be in contact with the first common layer L1 in the dummy light emitting element DED. The first common layer L1 and the second common layer L2 may be entirely formed on the substrate 110. The first common layer L1 and the second common layer L2 may be formed by a deposition process using an open mask, and the emission layers EL1, EL2, and EL3 may be formed by a deposition process using a fine metal mask.

A second electrode E21 of the first light emitting element ED1 and a second electrode E22 of the second light emitting element ED2 may be positioned on the second common layer L2. In addition, a second electrode E21 of the boundary light emitting element BED, a second electrode E23 of the copy light emitting element CED, and a second electrode E22 of the dummy light emitting element DED may be positioned on the second common layer L2. The second electrodes E21, E22, E23, and E24 may be referred to as common electrodes, and may be integrally formed. The second electrodes E21, E22, E23, and E24 may be made of a low work function metal such as calcium (Ca), barium (Ba), magnesium (Mg), aluminum (Al), silver (Ag), or a metal alloy, as a thin layer to have light transmittance. The second electrodes E21, E22, E23, and E24 may include a transparent conductive oxide such as an indium tin oxide (ITO) or an indium zinc oxide (IZO).

The first electrode E11, the first common layer L1, the emission layer EL1, the second common layer L2, and the second electrode E21 overlapping each other constitute the first light emitting element ED1 such as an organic light emitting diode in the first display area DA1. The first electrode E12, the first common layer L1, the emission layer EL2, the second common layer L2, and the second electrode E22 overlapping each other constitute the second light emitting element ED2 such as an organic light emitting diode and the boundary light emitting element BED belonging to the second light emitting element ED2 in the second display area DA2. The first light emitting element ED1 may overlap the first pixel circuit unit PC1 that is electrically connected thereto. The second light emitting element ED2 may not overlap the second pixel circuit unit PC2 that is electrically connected thereto. However, the second light emitting ED2 that is adjacent to the first display area DA1 may overlap the second pixel circuit unit PC2 that is electrically connected thereto.

The first electrode E13, the first common layer L1, the emission layer EL3, the second common layer L2, and the second electrode E23 overlapping each other constitute the copy light emitting element CED in the second display area DA2. The first electrode E14, the first common layer EL1, the second common layer L2, and the second electrode E24 overlapping each other constitute the dummy light emitting element DED in the second display area DA2. Because the dummy light emitting element DED does not include an emission layer, it is may not emit light and may function as a resistor configured to distribute a current. The dummy light emitting element DED may not include the first common layer L1 or the second common layer L2. When the first common layer L1 and/or the second common layer L2 are multi-layered, some of them may not be included.

The copy light emitting element CED and the dummy light emitting element DED may not overlap the second pixel circuit unit PC2 that is electrically connected thereto.

The first electrodes E11, E12, and E13 may be anodes of the light emitting elements ED1, ED2, BED, and CED, and the second electrodes E21, E22, and E23 may be cathodes of the light emitting elements ED1, ED2, BED, and CED.

An encapsulation layer (not illustrated) may be disposed on the second electrodes E21, E22, E23, and E24. The encapsulation layer may prevent penetration of moisture or oxygen from the outside. The encapsulation layer may be a thin film encapsulation layer including one or more inorganic layers and one or more organic layers. A touch sensor layer (not illustrated) including touch electrodes configured to sense a touch may be disposed on the encapsulation layer. An anti-reflection layer (not illustrated) configured to reduce external light reflection may be disposed on the touch sensor layer.

Figure 9:
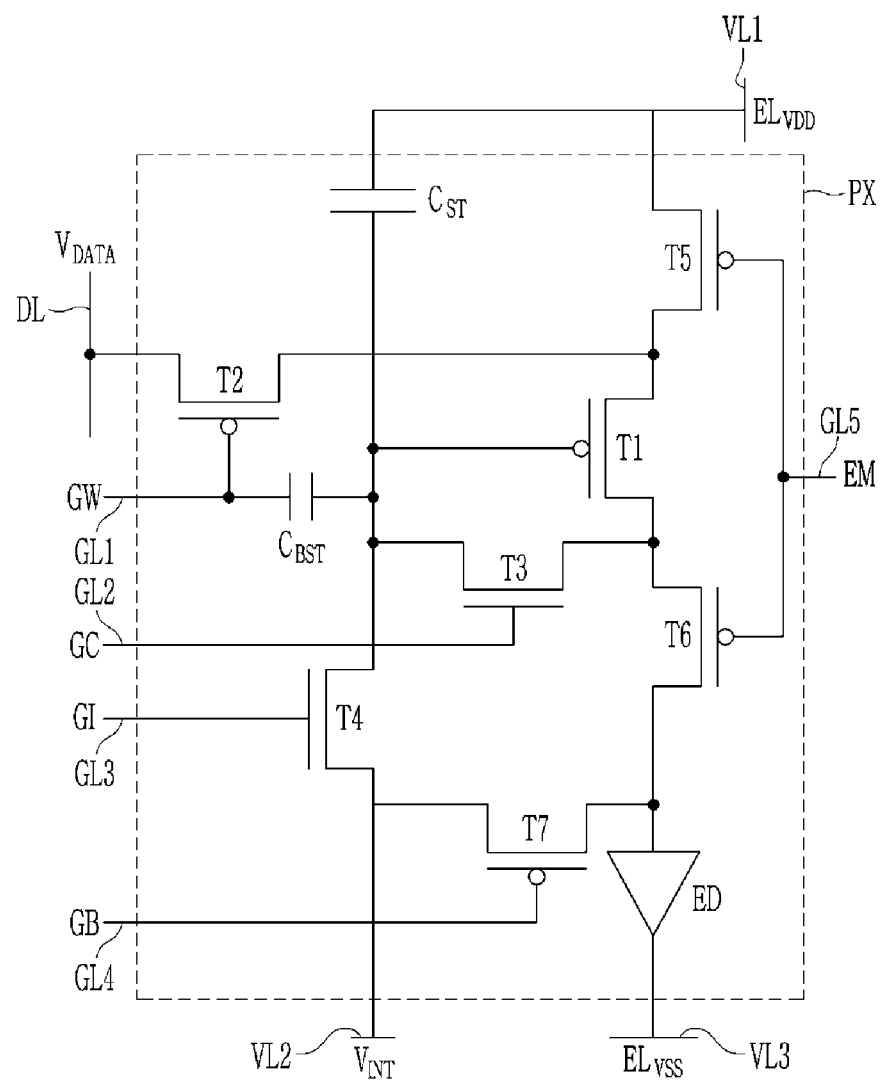
FIG. 9 is an equivalent circuit diagram illustrating a pixel of a display device according to an embodiment.

FIG. 9 is an equivalent circuit diagram illustrating a pixel of a display device according to an embodiment.

One pixel PX may include transistors T1 to T7, a storage capacitor $C_{ST}$, a boost capacitor $C_{BST}$, and a light emitting element ED which may be a light emitting diode, connected to several signal lines GL1 to GL5, DL, and VL1 to VL3. The light emitting element ED may be a first light emitting element ED1 or a second light emitting element ED2 described above. The first pixel circuit unit PC1 and second pixel circuit unit PC2 which are described above may correspond to pixel circuits except for the light emitting element ED in FIG. 9. The light emitting element ED may be the aforementioned boundary light emitting element BED, and the copy light emitting element CED and the dummy light emitting element DED described above may be connected in parallel to the light emitting element ED.

The signal lines GL1 to GL5, DL, and VL1 to VL3 may include gate lines GL1 to GL5, a data line DL, and voltage lines VL1 to VL3. The gate lines GL1 to GL5 may be electrically connected to the gate driver, and the data line DL may be electrically connected to the data driver. The gate lines GL1 to GL5 may include a scan line GL1, an inverted scan line GL2, an initialization control line GL3, a bypass control line GL4, and an emission control line GL5. The voltage lines VL1 to VL3 may include a driving voltage line VL1, an initialization voltage line VL2, and a common voltage line VL3. The driving voltage line VL1, the initialization voltage line VL2, and the common voltage line VL3 may each be connected to a voltage generator.

The second to seventh transistors T2 to T7 may receive respective gate signals through the gate lines GL1 to GL5.

The scan line GL1 may transfer a scan signal GW to the second transistor T2. The inverted scan line GL2 may transfer an inverted scan signal GC to the third transistor T3. The scan signal GW and the inverted scan signal GC may have opposite polarities. For example, when a high voltage is applied to the scan line GL1, a low voltage may be applied to the inverted scan line GL2.

The initialization control line GL3 may transfer an initialization control signal GI to the fourth transistor T4. The bypass control line GL4 may transfer the bypass signal GB to the seventh transistor T7. The bypass control line GL4 may be the line GL1 connected to the pixel PX that is adjacent in the second direction y. The emission control line GL5 may transfer the emission control signal EM to the fifth transistor T5 and the sixth transistor T6.

The data line DL may transfer the data voltage $V_{DATA}$. The driving voltage line VL1 may transfer the driving voltage $EL_{VDD}$, the initialization voltage line VL2 may transfer the initialization voltage $V_{INT}$, and the common voltage line VL3 may transfer the common voltage $EL_{VSS}$. Luminance of the light emitting element ED may be adjusted depending on a magnitude of the data voltage $V_{DATA}$ applied to the pixel PX. Each of the driving voltage $EL_{VDD}$, the initialization voltage $V_{INT}$, and the common voltage $EL_{VSS}$ may be a DC voltage having a predetermined level.

For the transistors T1 to T7, the first transistor T1 serving as the driving transistor may be a p-type transistor, and may include a polycrystalline semiconductor. It is a transistor that adjusts a level of a driving current outputted to an anode of the light emitting element ED depending on the data voltage $V_{DATA}$ applied to the gate electrode of the first transistor T1. A gate electrode of the first transistor T1 may be connected to a first electrode of the storage capacitor Cst. A first electrode of the first transistor T1 is connected to the second electrode of the second transistor T2, and is connected to the driving voltage line VL1 via the fifth transistor T5. A second electrode of the first transistor T1 is connected to the anode of the light emitting element ED via the sixth transistor T6.

The second transistor T2, which is a switching transistor, may be a p-type transistor and may include a polycrystalline semiconductor. A gate electrode of the second transistor T2 is connected to the scan line GL1, and is connected to a first electrode of a boost capacitor $C_{BST}$. A first electrode of the second transistor T2 is connected to the data line DL, and a second electrode of the second transistor T2 is connected to the first electrode of the first transistor T1. When the second transistor T2 is turned on by a gate-on voltage (low voltage) of the scan signal GW transferred through the scan line GL1, the data voltage $V_{DATA}$ transferred through the data line DL may be transferred to the first electrode of the first transistor T1.

The third transistor T3, which is a compensation transistor, may be an n-type transistor, and may include an oxide semiconductor. The third transistor T3 may electrically connect the second electrode and the gate electrode of the first transistor T1 to each other. As a result, a compensation voltage to which the data voltage $V_{DATA}$ is changed through the first transistor T1 may be transferred to the first electrode of the storage capacitor $C_{ST}$. A gate electrode of the third transistor T3 is connected to the inverted scan line GL2, and a first electrode of the third transistor T3 is connected to the second electrode of the first transistor T1. A second electrode of the third transistor T3 is connected to the first electrode of the storage capacitor $C_{ST}$, the gate electrode of the first transistor T1, and the second electrode of the boost capacitor $C_{BST}$. When the third transistor T3 is turned on by a gate-on voltage (high voltage) of the inverted scan signal GC that is received through the inverted scan line GL2, the third transistor T3 connects the gate electrode of the first transistor T1 and the second electrode of the first transistor T1. A voltage applied to the gate electrode of the first transistor T1 is stored in the storage capacitor $C_{ST}$, and the storage capacitor $C_{ST}$ may constantly maintain a voltage of the gate electrode of the first transistor T1 for one frame.

The fourth transistor T4, which is an initialization transistor, may be an n-type transistor, and may include an oxide semiconductor. A gate electrode of the fourth transistor T4 is connected to the initialization control line GL3. The fourth transistor T4 may initialize the gate electrode of the first transistor T1 and the first electrode of the storage capacitor $C_{ST}$ to the initialization voltage $V_{INT}$. The gate electrode of the fourth transistor T4 is connected to the initialization control line GL3, and a first electrode of the fourth transistor T4 is connected to the initialization voltage line VL2. A second electrode of the fourth transistor T4 is connected to the first electrode of the storage capacitor $C_{ST}$, the gate electrode of the first transistor T1, and the second electrode of the boost capacitor $C_{BST}$. The fourth transistor T4 may be turned on by a gate-on voltage (high voltage) of the initialization control signal GI that is received through the initialization control line GL3, and the initialization voltage $V_{INT}$ may be transferred to the gate electrode of the first transistor T1 and the first electrode of the storage capacitor $C_{ST}$.

The fifth transistor T5, which is an operation control transistor, may be a p-type transistor and may include a polycrystalline semiconductor. The fifth transistor T5 may transfer the driving voltage $EL_{VDD}$ to the first transistor T1. A gate electrode of the fifth transistor T5 is connected to the emission control line GL5, a first electrode of the fifth transistor T5 is connected to the driving voltage line VL1, and a second electrode of the fifth transistor T5 is connected to the first electrode of the first transistor T1. The sixth transistor T6, which is an emission control transistor, may be a p-type transistor and may include a polycrystalline semiconductor. The sixth transistor T6 may transfer the driving current that is outputted from the first transistor T1 to the light emitting element ED. The gate electrode of the sixth transistor T6 is connected to the emission control line GL5, a first electrode of the sixth transistor T6 is connected to the second electrode of the first transistor T1, and a second electrode of the sixth transistor T6 is connected to the anode of the light emitting element ED.

The seventh transistor T7, which is a bypass transistor, may be a p-type transistor and may include a polycrystalline semiconductor. The seventh transistor T7 may initialize the anode of the light emitting element ED. A gate electrode of the seventh transistor T7 is connected to the bypass control line GL4, a first electrode of the seventh transistor T7 is connected to the anode of the light emitting element ED, and a second electrode of the seventh transistor T7 is connected to the initialization voltage line VL2. When the seventh transistor T7 is turned on by the gate-on voltage (low voltage) of the bypass signal GB, the initialization voltage $V_{INT}$ may be applied to the anode of the light emitting element ED.

The second electrode of the storage capacitor CST is connected to the driving voltage line VL1. The cathode of the light emitting element ED is connected to the common voltage line VL3 that transfers the common voltage $EL_{VSS}$.

As described above, the first transistor T1 may include a polycrystalline semiconductor, and the third transistor T3 and the fourth transistor T4 may include an oxide semiconductor. The second transistor T2, the fifth transistor T5, the sixth transistor T6, and the seventh transistor T7 may include a polycrystalline semiconductor. Accordingly, the first transistor T1 may have high electron mobility, and leakage currents of the third transistor T3 and the fourth transistor T4 may be reduced. As such, more stable driving may be achieved and reliability may be improved by allowing the third transistor T3 and the fourth transistor T4 to include a semiconductor material that is different from that of the first transistor T1. At least one of the second transistor T2, the fifth transistor T5, the sixth transistor T6, and the seventh transistor T7 may include an oxide semiconductor.

A low voltage may be applied to the inverted scan line GL2 when a high voltage is applied to the scan line GL1, and a high voltage may be applied to the inverted scan line GL2 when a low voltage is applied to the scan line GL1. Because the inverted scan signal GC applied to the inverted scan line GL2 is inverted from the scan signal GW applied to the scan line GL1, the gate voltage of the first transistor T1 may be reduced after a data voltage is written. Conversely, the scan signal GW may increase the gate voltage of the first transistor T1. The boost capacitor $C_{BST}$ is positioned between the scan line GL1 and the gate electrode of the first transistor T1, so that the gate voltage of the first transistor T1 may be stabilized. The boost capacitor $C_{BST}$ may compensate for an increase or decrease of the gate voltage of the first transistor T1 when the inverted scan signal GC is changed to a high voltage or a low voltage.

Unlike the illustrated embodiment, the third transistor T3 and the fourth transistor T4 may also include a polycrystalline semiconductor, and may be a p-type transistor. In this case, the second transistor T2 and the third transistor T3 may receive a same gate signal, and the pixel PX may not include the boost capacitor $C_{BST}$.

In the illustrated embodiment, the pixel PX includes seven transistors T1 to T7 and one storage capacitor $C_{ST}$ and one boost capacitor $C_{BST}$, but a number of transistors, a number of capacitors, and a connection relationship thereof may be variously changed.

While the inventive concept has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
 a first display area;
 a second display area disposed adjacent to the first display area;
 a driver at least partially disposed in the second display area;
 a plurality of first light emitting elements disposed in the first display area;
 a plurality of second light emitting elements disposed in the second display area and including a boundary light emitting element adjacent to the first display area and a driver light emitting element overlapping the driver; and
 a copy light emitting element and a dummy light emitting element disposed in the second display area and electrically connected to the boundary light emitting element.

2. The display device of claim 1, wherein
 the boundary light emitting element and the copy light emitting element each include an emission layer, and the dummy light emitting element does not include an emission layer.

3. The display device of claim 2, wherein
 the boundary light emitting element, the copy light emitting element, and the dummy light emitting element each include a first electrode and a second electrode overlapping each other,
 first electrodes of the boundary light emitting element, the copy light emitting element, and the dummy light emitting element are electrically connected to each other, and
 second electrodes of the boundary light emitting element, the copy light emitting element, and the dummy light emitting element are electrically connected to each other.

4. The display device of claim 3, wherein
 the boundary light emitting element, the copy light emitting element, and the dummy light emitting element each include a first common layer and a second common layer disposed between the first electrode and the second electrode,
 the emission layer is disposed between the first common layer and the second common layer of the boundary light emitting element and the copy light emitting element, and
 the first common layer and the second common layer of the dummy light emitting element are in contact with each other.

5. The display device of claim 1, wherein
 the boundary light emitting element, the copy light emitting element, and the dummy light emitting element are disposed between the plurality of first light emitting elements and the driver light emitting element.

6. The display device of claim 1, wherein
 the boundary light emitting element and the copy light emitting element display a same color.

7. The display device of claim 1, further comprising:
 a plurality of first pixel circuit units disposed in the first display area and electrically connected to the plurality of first light emitting elements; and
 a plurality of second pixel circuit units disposed in the first display area and electrically connected to the plurality of second light emitting elements,
 wherein the copy light emitting element and the dummy light emitting element do not overlap a second pixel circuit unit that is electrically connected thereto.

8. The display device of claim 7, wherein
 the boundary light emitting element overlaps a second pixel circuit unit that is electrically connected thereto.

9. The display device of claim 7, wherein
 the driver light emitting element does not overlap a second pixel circuit unit that is electrically connected thereto.

10. The display device of claim 1, wherein
 the boundary light emitting element has a same size as a first light emitting element displaying a same color among the plurality of first light emitting elements.

11. The display device of claim 1, wherein
 the boundary light emitting element has a smaller size than the driver light emitting element.

12. The display device of claim 11, wherein
 the copy light emitting element has a same size as the boundary light emitting element.

13. The display device of claim 1, wherein
 the plurality of second light emitting elements are arranged in a matrix form,
 the copy light emitting element is arranged in a same row as the boundary light emitting element, and
 the dummy light emitting element is arranged in a row that is different from that of the boundary light emitting element.

14. The display device of claim 13, wherein
 the dummy light emitting element is disposed between two second light emitting elements displaying a color that is different from a color displayed by the boundary light emitting element.

15. The display device of claim 14, wherein
 the boundary light emitting element displays blue or red, and the two second light emitting elements displaying the different color display green.

16. The display device of claim 14, wherein
 the first display area includes a rounded corner portion, and
 the boundary light emitting element is adjacent to the corner portion.

17. The display device of claim 1, wherein
 the plurality of second light emitting elements include a second light emitting element electrically connected to a plurality of copy light emitting elements.

18. A display device comprising:
 a first display area;
 a second display area disposed adjacent to the first display area;
 a plurality of first light emitting elements disposed in the first display area;
 a plurality of second light emitting elements disposed in the second display area;
 a dummy light emitting element disposed in the second display area and electrically connected to one of the plurality of second light emitting elements; and
 a driver at least partially disposed in the second display area.

19. The display device of claim 18, wherein
 the dummy light emitting element includes a first electrode and a second electrode overlapping each other, and does not include an emission layer disposed between the first electrode and the second electrode.

20. The display device of claim 18, wherein
 a second light emitting element connected to the dummy light emitting element among the plurality of second light emitting elements has a smaller size than a second light emitting element overlapping the driver among the plurality of second light emitting element and has a same size as the first light emitting element.

* * * * *